(12) United States Patent
Lehtinen et al.

(10) Patent No.: US 9,393,824 B2
(45) Date of Patent: Jul. 19, 2016

(54) METHOD OF MANUFACTURING LIQUID FLOW GUIDING STRUCTURES TO POROUS SUBSTRATES

(75) Inventors: Kaisa Lehtinen, VTT (FI); Juuso Olkkonen, VTT (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 545 days.

(21) Appl. No.: 13/515,933

(22) PCT Filed: Dec. 15, 2010

(86) PCT No.: PCT/FI2010/051034
§ 371 (c)(1),
(2), (4) Date: Aug. 31, 2012

(87) PCT Pub. No.: WO2011/073519
PCT Pub. Date: Jun. 23, 2011

(65) Prior Publication Data
US 2013/0004665 A1   Jan. 3, 2013

(30) Foreign Application Priority Data
Dec. 15, 2009   (FI) ...................................... 20096334

(51) Int. Cl.
*B41M 3/00* (2006.01)
*B01L 3/00* (2006.01)
(Continued)

(52) U.S. Cl.
CPC ............... *B41M 3/006* (2013.01); *B01L 3/5023* (2013.01); *B82Y 10/00* (2013.01); *B82Y 40/00* (2013.01); *G03F 7/0002* (2013.01);
(Continued)

(58) Field of Classification Search
CPC ....................... B01L 233/126; B01L 2300/126
See application file for complete search history.

(56) References Cited

U.S. PATENT DOCUMENTS 4,151,315 A * 4/1979 Fock .................... B41M 3/18
156/277
6,509,085 B1   1/2003 Kennedy
(Continued)

FOREIGN PATENT DOCUMENTS

| JP | 2005-166453 A | 6/2005 |
|---|---|---|
| SU | 868582 A1 | 9/1981 |
| WO | WO 2010/003188 A1 | 1/2010 |

OTHER PUBLICATIONS

Bruzewicz, Reches, Whitesides, Low-cost printing of poly(dimethylsiloxane) barriers to define microchannels in paper, Anal. Chem. 2008, 80, 3387-3392.*

(Continued)

*Primary Examiner* — James M Mellott
(74) *Attorney, Agent, or Firm* — Birch, Stewart, Kolasch & Birch, LLP

(57) ABSTRACT

The invention relates to a method for manufacturing liquid-guiding structural layers by flexo or gravure printing on a substrate sheet, using a printing solution, which alters the properties of the substrate sheet in such a way that liquid flow is prevented in the area of the structural layers. The penetrability of the printing layer into the substrate sheet can be regulated by the printing-cylinder pressure and the composition of the printing solution. In the method it is possible to use printing solutions consisting of economical polymers and a solvent. In terms of printing technology, the invention is compatible with existing printing machines and is thus highly suitable for mass production.

7 Claims, 4 Drawing Sheets

(51) Int. Cl.
  *B82Y 10/00* (2011.01)
  *B82Y 40/00* (2011.01)
  *G03F 7/00* (2006.01)
  *B41M 1/04* (2006.01)
  *B41M 1/10* (2006.01)

(52) U.S. Cl.
  CPC ....... *B01L 2200/12* (2013.01); *B01L 2300/089* (2013.01); *B01L 2300/0864* (2013.01); *B01L 2300/12* (2013.01); *B01L 2300/126* (2013.01); *B41M 1/04* (2013.01); *B41M 1/10* (2013.01)

(56) References Cited

U.S. PATENT DOCUMENTS

| 2002/0024662 | A1 | 2/2002 | Ueno et al. | |
| 2004/0099389 | A1* | 5/2004 | Chen et al. | 162/134 |
| 2004/0241451 | A1 | 12/2004 | Clark et al. | |
| 2004/0248326 | A1 | 12/2004 | Ziaie et al. | |
| 2008/0075837 | A1* | 3/2008 | Bower | 427/58 |
| 2009/0298191 | A1 | 12/2009 | Whitesides et al. | |

OTHER PUBLICATIONS

Aikio et al., Bioactive paper and fibre products, Patent and literature survey, VTT Working Papers 51, Espoo 2006.*
Carrilho et al., Paper Microzone Plates, Anal, Chem, 2009, 81, 5990-5998.*
Chinese Office Action, dated Feb. 28, 2014, for Chinese Application No. 201080056975.6 with an English translation.
International Search Report for PCT/FI2010/051034 dated Apr. 19, 2011.

* cited by examiner

METHOD OF MANUFACTURING LIQUID FLOW GUIDING STRUCTURES TO POROUS SUBSTRATES

TECHNICAL FIELD

The present invention relates to a method, according to the preamble of claim 1, for manufacturing structural layers guiding a liquid flow on porous substrate sheets.

BACKGROUND ART

In many porous substrates, such as nitrocellulose sheets, cellulose-based papers, and porous polymer sheets, liquids travel laterally along the substrate sheet. The flow is generally capillary. Such sheets are exploited in many applications in the field of diagnostics, such as in biosensors and immunoassay-lateral-flows. In these applications, a strip has been used, in which the liquid travels laterally along the entire width of the strip, cut from a substrate sheet. In multi-analysis-tests, in which the sample liquid must be transported to several reaction/detection areas, it is advantageous for it to be possible to form the substrate sheet in such a way that the sample liquid travels in only specific parts of the sheet, i.e. structural layers guiding the liquid flow are formed in the sheet.

Structural layers guiding the liquid flow can be manufactured in porous substrate sheets using many different methods. Patent US 2009/0298191 A1) (Lateral flow and flow-through bioassay devices based on patterned porous media, methods of making same and methods of using same) discloses, among others, the following methods:

- A substrate sheet is saturated with a photoresist, exposed to UV light through a photo-mask defining the liquid channels, and finally developed, when the photoresist is dissolved off the locations of the liquid channels. In this way, areas saturated with photoresist are created, which define the edges of the liquid channels.
- A hardening polymer, e.g., polydimethylsiloxane (PDMS), is spread on a stamp, the relief pattern of which defines the boundary areas of the liquid channels. After this, the stamp is pressed onto the substrate sheet, for example, for 20 seconds. Finally, the stamp is removed and the polymer is hardened.
- Liquids, which are either hydrophobic themselves, or which can convert the substrate sheet to become hydrophobic, can be applied on the substrate sheet according to a desired pattern, for example, using the following methods: spraying the liquid through a stencil, by silk-screen printing, by inkjet printing, or using a plotter.
- The desired areas of the substrate are saturated to become hydrophobic by absorbing wax with the aid of heat.

In the publication D. A. Bruzewicz, M. Reches, and G. M. Whitesides, 'Low-cost printing of poly(dimethylsiloxane) barriers to define microchannels in paper', Anal. Chem., 2008, 80 (9), 3387-3392, barrier lines guiding liquid flow are manufactured using a PDMS solution as an ink in the pen of a plotter.

With the exception of the photoresist-based method, the precision of the edges of the liquid-flow channels are a problem in the aforementioned methods according to the prior art. Because the liquid, which alters the substrate sheet in such a way as to guide a liquid flow, must be absorbed through the entire substrate sheet, it also spreads at the same time laterally and thus the edges of the liquid-flow channel do not become precise.

The publication K. Abe, K. Suzuki, and D. Citterio, 'Inkjet-printed microfluidic multianalyte chemical sensing paper', Anal. Chem., 80 (18), 6928-6934, 2008, discloses a method, in which the paper in first saturated with a 1.0 w-% polystyrene-toluene solution, dried, and the liquid channels are finally etched open by inkjet printing with toluene. The inkjet printing generally has to be repeated 10-30 times to achieve a sufficient etching depth, which makes it difficult to use the method in roller-to-roller manufacturing processes.

All of the aforementioned manufacturing methods according to the prior art are quite slow and thus difficult to use in industrial mass-manufacturing processes. In patent US 2009/0298191 A1, it is estimated that patterning a single 10×10 cm substrate sheet using a photoresist-based method takes about 8-10 minutes and with a method using a stamp about 2 minutes.

DISCLOSURE OF INVENTION

The present invention is intended to present a new method, which permits the cost-effective and rapid manufacture of structural layers guiding liquid flow on porous substrates. For example, with the aid of the invention patterned liquid-flow channels can be manufactured on porous hydrophilic paper.

The invention is particularly to create a method, which is simultaneously cost-effective, fast, and has precise edge lines at the liquid channels.

The aforementioned objectives are achieved by the method that is the object of the invention for manufacturing structural layers guiding liquid on a porous substrate sheet by flexo or gravure printing, using a printing solution, which changes the properties of the substrate sheet in such a way that the liquid flow is prevented in the area of the printed structural layers.

More specifically, the method according to the invention is characterized by what is stated in the characterizing portion of claim 1.

One significant advantage of the invention is that, in terms of printing technology, it is compatible with existing printing machines and thus is highly suitable for mass production.

The invention also has the advantage that simple solutions, comprising a polymer and a solvent, or solutions substantially consisting of them, are considerably more economical than, for example, commercial photoresists, which are used in the methods according to the prior art.

The embodiments of the invention offer significant additional advantages.

According to one embodiment, the penetration of the printing solution in the depth direction of the substrate sheet is regulated by adjusting the pressure between the printing cylinder and the substrate sheet. By using a suitable printing-cylinder pressure and making a printing solution with a suitable viscosity, the solvent of which evaporates rapidly, the lateral spread of the printing solution is kept small and thus the edge areas of the structures guiding the liquid flow are made sharp. The properties of the printing solution can also be optimized by using a solvent with several different boiling points.

The penetration of the printing solution into the substrate sheet can be boosted by printing several printing-solution layers on top of each other.

If the substrate sheet is so thick, that a printing-solution layer printed on the front side does not penetrate through the entire substrate, either a patterned or a unified printing-solution layer can be printed on the rear surface of the substrate. When the printing-solution layers printed on the front and rear sides meet, a structural layer guiding liquid flow is achieved. If the invention is used for the manufacture of liquid-flow channels, a unified printing-solution layer printed on the rear side has the advantage that it simultaneously acts as a protected layer, which prevents the liquid from escaping through the under surface of the substrate.

BRIEF DESCRIPTION OF DRAWINGS

In the following, the embodiments and other advantages of the invention are examined in greater detail with reference to the accompanying drawings.

DETAILED DESCRIPTION OF EMBODIMENTS

Figure 1:
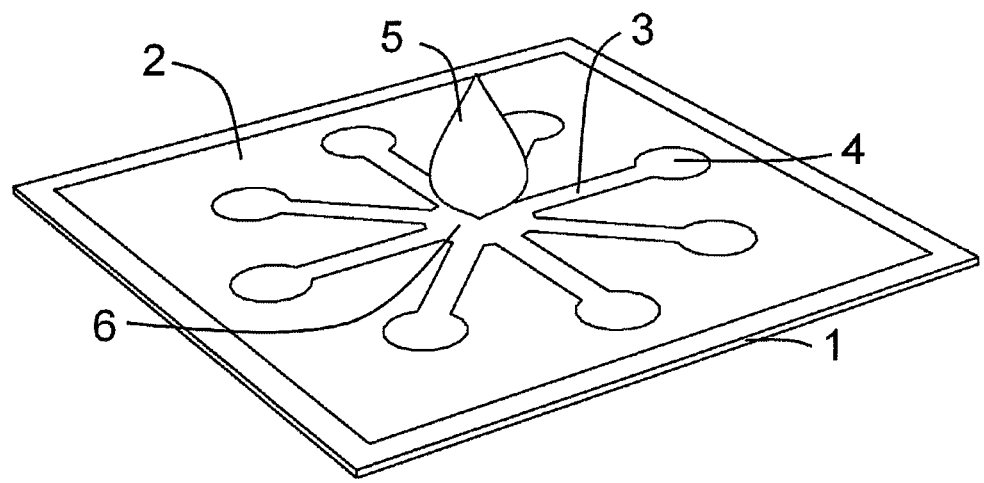
FIG. 1 presents the structure according to one embodiment of the invention.

FIG. 1 illustrates a structure according to one embodiment of the invention. A structural layer 2 is formed on a substrate sheet 1, due to the effect of which liquid can travel in the substrate sheet only along the liquid-flow channels 3 to the detection/reaction areas 4. A sample drop 5 is applied to the intersection 6 of the flow channels. The structural layer 2 extends through the entire depth of the substrate sheet in the thickness direction.

For example a polymer dissolved in an organic solvent, such as polystyrene, polymethylmethacrylate, or cellulose acetate, can be used as a printing solution, the task of which is to form the substrate sheet in such a way that the liquid flow is prevented in the area of the printed layers. Other possible substances are alkyne ketene dimer and cross-linked polyvinylalcohol PVA. Polystyrene is preferred, because it does not demand heat treatment and is completely bio-compatible.

It is preferable to use a printing solution made in an organic solvent than a water-based printing solution, as the porous structure of cellulose-based substrates often breaks more easily due to the effect of water than that of organic solvents. The solvent can be, for example, toluene, xylene, or a mixture of these.

The amount of polymer in the solution can be, for example, 1-40 weight-%.

According to one embodiment, a printing solution with a relatively low polymer concentration is used, preferably of 2-10 weight-%, most suitably 3.5-7 weight-%. By using a low concentration, a greater structural depth is generally achieved, but the final concentration of polymer in the substrate will be correspondingly lower. This can be compensated for by increasing the number of print layers. According to one embodiment, at such a low polymer concentration there is at least two print layers.

According to a second embodiment, a relatively high polymer concentration of preferably 10-40 weight-%, most suitably 15-35 weight-%, is used. It has been observed in tests that, in printing solutions equipped with polymers with a particularly low molecular mass, such as polystyrene, the viscosity in this concentration range will still be sufficiently low for printing using the printing methods according to the invention and they still penetrate well into the pores of the substrate. In addition, due to the short chains, the properties of the printed structure can be, in many cases, better than when using polymer materials with a longer chain. In particular, such a material will probably form a denser barrier layer. Thus, as little as a single printing may be sufficient.

The molecular mass of the polymer used can be, for example, 2500-500 000. If the concentration of the polymer is greater than 10 weight-% of the printing solution, it is preferable to use a polymer with a molecular mass of 250 000 at most, particularly 100 000 at most. For example, in tests using a 20 weight-% concentration, it has been observed that bimodal polystyrene with a mean molecular mass of about 35 000 produces a very good print result, in terms of the liquid-guiding ability of the channels formed. However, it should be noted that the optimal molecular mass depends not only of the concentration, but also on other factors, such as the substrate material, the material that it is intended to place in the channel, and on the final application.

Figure 4A:
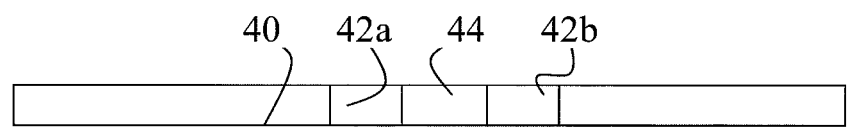
FIG. 4a shows a schematic side cross-section of a structure according to one embodiment of the invention.

FIG. 4a shows schematically the structure according to one embodiment of the invention. A first hydrophobic print zone 42a and a second hydrophobic print zone 42b are printed on the substrate 40, between which remains an unprinted hydrophilic sample zone 44. Liquid brought to the sample zone 44 will remain in the zone in question, thanks to the print zones 42a, 42b.

The width of a flow channel is typically 30 μm-5 mm, particularly 0.25 mm-4 mm.

There can be one or more print layers on top of each other. 1-3 print layers are typically used. By using several layers on top of each other, the polymer can be carried deeper into the substrate to reinforce the liquid-guiding effect of the print structures. A similar effect can also be achieved by increasing the pressure between the printing substrate and the printing cylinder.

The polymer concentration, the printing pressure, and the number of printings are preferably selected in such a way that a structure zone extending to the full depth of the substrate is achieved.

Figure 4B:
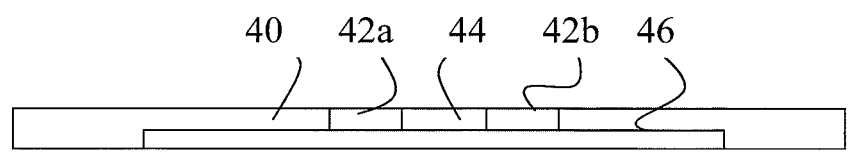
FIG. 4b shows a schematic side cross-section of a structure according to a second embodiment of the invention.

A unified or local layer 46 can also be printed on the rear surface of the substrate, as shown in FIG. 4b. This layer typically extends over the entire width of the sample zone 44 and prevents the liquid from coming through the substrate in its thickness direction. Thus, there is a depth-direction barrier layer 46 in the structure, in addition to the lateral barrier layers 42a, 42b. At the same time, the lateral liquid guiding effect improves and the need for print layers or pressure on the front surface of the substrate is reduced. There is also the advantage that, because the capillary volume decreases, the need for sample substantially decreases. The movement of foreign substances into the sample zone from the base of the substrate (e.g., a table top) is also effectively prevented.

According to on embodiment, there are openings in the barrier layer 46 printed on the rear surface of the substrate, for feeding sample to the sample zone 44 and/or removing it from it, for example to a second substrate placed on top of the first substrate.

Any porous substrate whatever, in which a water-based sample progresses laterally, can be used as the substrate. Such substrates are, for example, nitrocellulose sheets, cellulose-based papers, and porous polymer sheets. In particular, chromatography papers designed for this purpose can be used.

Figure 2:
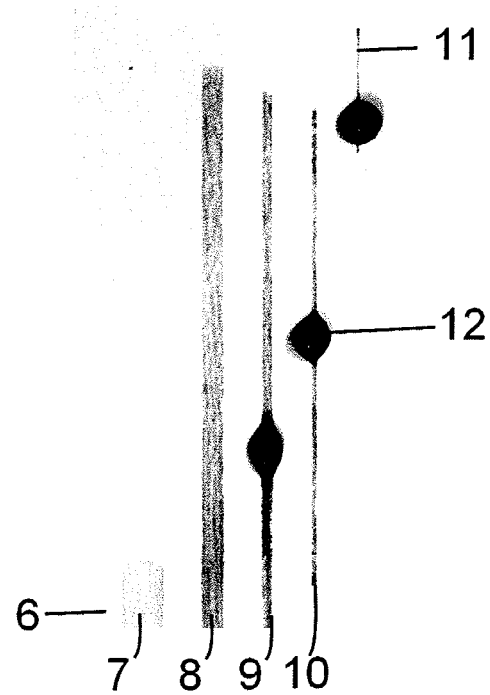
FIG. 2 shows an example of finished structure layers guiding the liquid flow.

FIG. 2 shows an example of liquid-flow guiding structural layers manufactured on paper (50 g/m$^2$) made from Eucalyptus fibres. Due to the effect of the structural layers 6, the liquid can only progress along the liquid channels 7-11. Channel 7 is 4-mm wide and channel 11 is 0.25-mm wide. In the figure, drops of water 12, which have spread by capillary action in the channels, and coloured with foodstuffs colours are applied to the liquid channels. The structural layers 6 guiding the liquid flow are formed in the paper by flexo 15 printing three print layers of a 5 weight-% polystyrene-xylene solution on top of each other. An RK Flexiproof 100 unit was used as the printing device. The printing speed was 60 in/min. The printing cylinder pressure was optimized to achieve the best result. If a single unified printing-solution layer was printed on the rear side of the paper, a single patterned layer on the front side would be sufficient to create patterned liquid channels.

Figure 3:
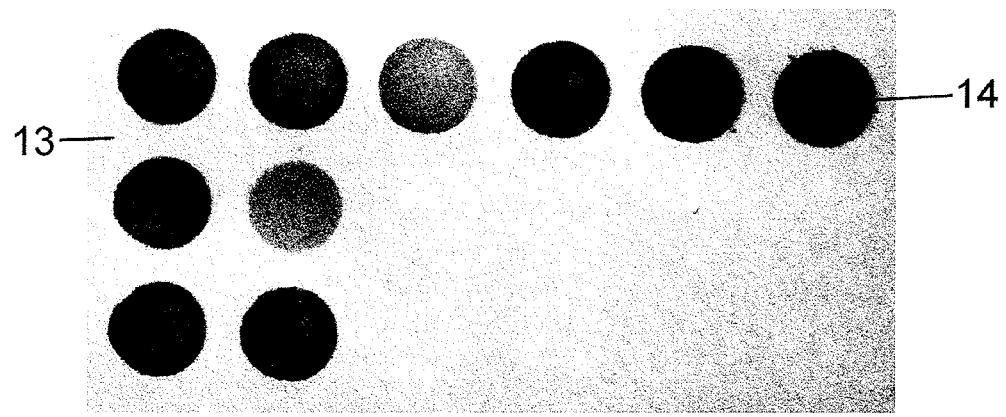
FIG. 3 presents an example of a micro-titre plate manufactured using the method according to the invention.

FIG. 3 shows an example of a micro-titre plate manufactured on paper (50 g/m$^2$) made from Eucalyptus. The paper contains 7-mm diameter 'sample wells' 14, into each of which 20 μl of water coloured with foodstuffs colour is applied. A structural layer 13 guiding the liquid flow is formed around the sample wells, in the same way as in the example of FIG. 2.

Figure 5:
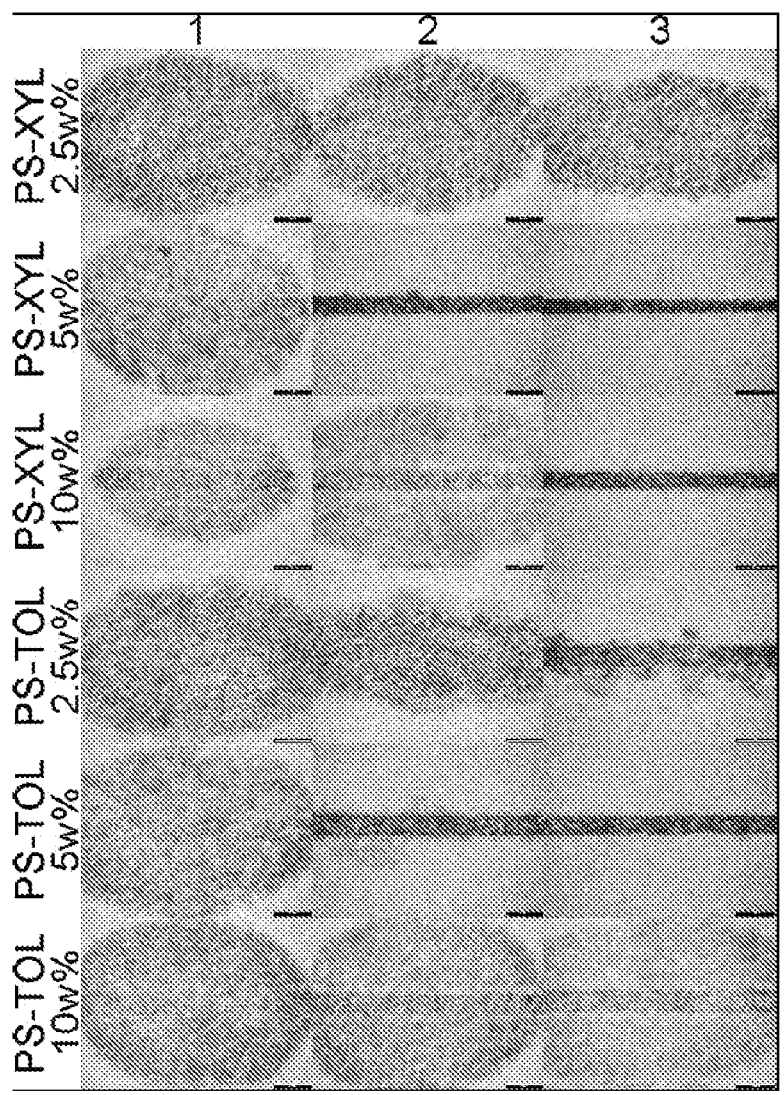
FIG. 5 illustrates the travel of liquid in liquid channels manufactured in different ways.

FIG. 5 shows the spreading of a sample solution in liquid channels made in different ways. Using both a polystyrene-xylene (PS-XYL) solution and a polystyrene-toluene (PS-TOL) solution, the best guiding effect on a sample (foodstuffs-coloured deionized water) was achieved using a polymer concentration of 5 weight-% and using at least two print layers. In all the cases in the figure the width of the solution zone is 1 mm.

Figure 6:
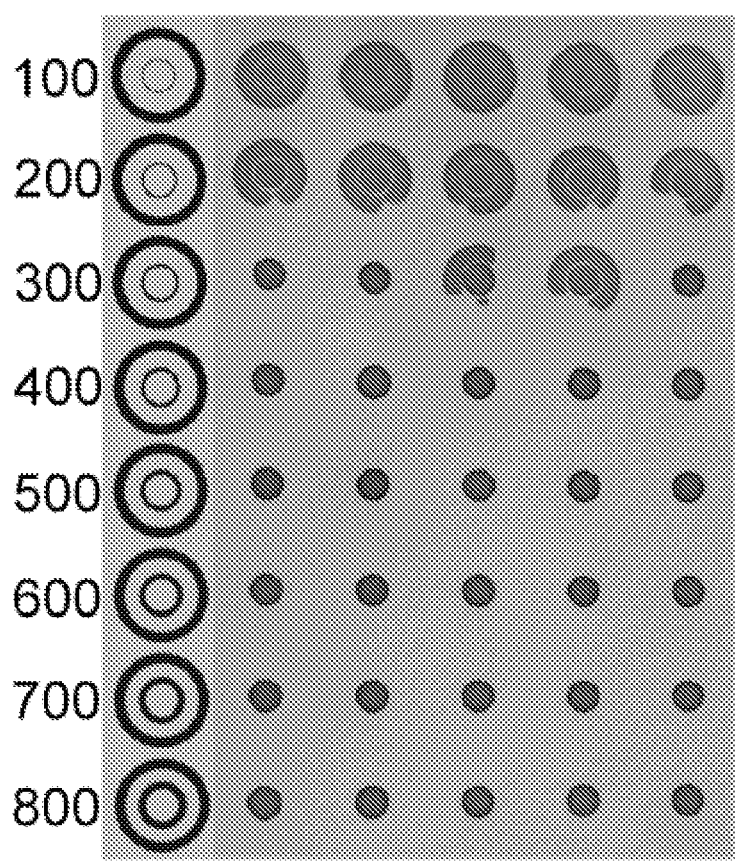
FIG. 6 illustrates the effect of the width of a produced structural zone on its ability to prevent a lateral liquid flow.

FIG. 6 shows the effect of the lateral width of the barrier zone on the capillary travel of a liquid. A 5-weight-% polystyrene-xylene solution was printed on chromatography paper as 100-800-μm rings (inner ring). Inside the ring, 5 μl of coloured deionized water was applied. It was observed that the lateral flow to the barrier zone was entirely prevented using a structural width of about 400 μm. By optimizing the printing process and the materials, it is possible to achieve structures of even about 100 μm, which are nevertheless sufficiently tight.

According to one embodiment, in the same printing process, in which liquid-flow guiding structures are produced, biomolecules or other reagents for diagnostic tests are also printed on the substrate. Thus, entire analysis means can be easily manufactured, for example, using the roller-to-roller method.

The invention claimed is:

1. A method for manufacturing printed structural layers on a porous substrate sheet for guiding a liquid flow, comprising:
   forming the printed structural layers on the substrate sheet by flexo or gravure printing by using a printing solution, which penetrates into the substrate sheet and alters the properties of the substrate sheet in such a way that liquid flow is prevented in the area of the printed structural layers, so that the printed structural layers extend over the entire thickness of the substrate and form a liquid flow channel on the substrate sheet, wherein
   the printing solution comprises a polymer and a solvent, an amount of the polymer being approximately 5% by weight,
   the polymer is polystyrene,
   the solvent is at least one solvent selected from the group consisting of toluene and xylene, at least two printed layers of the printed structural layers are printed at a distance from each other on a front side of the substrate sheet, so that a lateral flow channel is formed between the at least two printed layers of the printed structural layers, and
   one or more patterned printing solution layer is printed on a front side of the substrate sheet and one or more unified printing solution layer is printed on a rear side of the substrate sheet,
   so that the unified printing solution layer extends over the entire width of the lateral flow channel and prevents the liquid from in a depth direction from coming through the substrate.

2. The method according to claim 1, wherein the penetration of the printing solution into the substrate sheet is optimized with the aid of the printing-cylinder pressure, the number of printings, the solvent of the printing solution, and/or the viscosity of the printing solution.

3. The method according to claim 1, wherein several layers of the printing solution are printed on a surface of the substrate sheet, so that the several layers of the printed structural layers are stacked on each other.

4. The method according to claim 1, wherein the printing solution is printed on both sides of the substrate sheet, so that at least one layer of the printed structural layers is formed on a front side of the substrate sheet and at least one layer of the printed structural layers is formed on the rear side of the substrate sheet.

5. The method according to claim 1, wherein width of the structural layer in the lateral direction of the substrate is at least 100 μm.

6. The method according to claim 1, wherein the printed structure layers are formed so that:
   a plurality of flow channels are delimited by the printed structural layers and disposed so that at least two flow channels form an intersection;
   an application zone is located at the intersection of the flow channels;
   a detection or reaction area is connected to each flow channel.

7. The method according to claim 1, wherein the printing solution is printed on both sides of the substrate sheet, so that at least two layers of the printed structural layers are formed on a front side of the substrate sheet and at least one layer of the printed structural layers is formed on the rear side of the substrate sheet.

\* \* \* \* \*